United States Patent
Kamiguchi et al.

(10) Patent No.: US 7,999,437 B2
(45) Date of Patent: Aug. 16, 2011

(54) ACOUSTIC BOUNDARY WAVE DEVICE AND ELECTRONIC APPARATUS USING THE SAME

(75) Inventors: Hiroki Kamiguchi, Osaka (JP); Hidekazu Nakanishi, Osaka (JP); Yosuke Hamaoka, Osaka (JP); Shoji Okamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 40 days.

(21) Appl. No.: 12/619,077

(22) Filed: Nov. 16, 2009

(65) Prior Publication Data
US 2010/0127597 A1  May 27, 2010

(30) Foreign Application Priority Data
Nov. 25, 2008  (JP) ................................. 2008-298962

(51) Int. Cl.
*H03H 9/25* (2006.01)
(52) U.S. Cl. ...................... 310/313 R; 310/340; 333/193
(58) Field of Classification Search .............. 310/313 R, 310/340; 333/193
See application file for complete search history.

(56) References Cited

U.S. PATENT DOCUMENTS

| | | | | |
|---|---|---|---|---|
| 5,792,072 A * | 8/1998 | Keefe | | 600/559 |
| 7,466,061 B2 | 12/2008 | Miura et al. | | |
| 2004/0016895 A1 * | 1/2004 | Amartur | | 250/559.27 |
| 2005/0030125 A1 * | 2/2005 | Nakano et al. | | 333/133 |
| 2006/0087199 A1 * | 4/2006 | Larson et al. | | 310/318 |
| 2007/0278898 A1 * | 12/2007 | Miura et al. | | 310/313 R |

FOREIGN PATENT DOCUMENTS

JP  2007-329584  12/2007

* cited by examiner

*Primary Examiner* — Thomas Dougherty
(74) *Attorney, Agent, or Firm* — Panasonic Patent Center; Dhiren Odedra; Kerry Culpepper

(57) ABSTRACT

An acoustic boundary wave device includes a piezoelectric body, an IDT layer formed on the piezoelectric body, a pad electrode layer formed on the piezoelectric body and connected to the IDT layer, a first dielectric layer formed on the piezoelectric body and covering at least a part of the IDT electrode layer, and a second dielectric layer formed on the piezoelectric body, covering the first dielectric layer, and having an opening through which at least a part of a top face of the pad electrode layer is exposed. The metal forming lateral faces of the pad electrode layer diffuses more readily into the first dielectric layer than into the second dielectric layer. The second dielectric layer covers the lateral faces of the pad electrode layer and prevents the first dielectric layer from touching the lateral faces of the pad electrode layer.

7 Claims, 4 Drawing Sheets

ACOUSTIC BOUNDARY WAVE DEVICE AND ELECTRONIC APPARATUS USING THE SAME

BACKGROUND

1. Technical Field

The technical field relates to an acoustic boundary wave device and an electronic apparatus including the same device.

2. Background Art

FIGS. 5 and 6 show sectional schematic diagrams of a conventional acoustic boundary wave device. The device shown in FIG. 5 includes piezoelectric body 2, interdigital transducer (IDT) electrode layer 3, pad electrode layer 4, first dielectric layer 5, and second dielectric layer 6. Piezoelectric body 2 is formed of lithium niobate or lithium tantalate, for example. IDT electrode layer 3 is formed of copper, for example, and placed on piezoelectric body 2. Pad electrode layer 4 is formed on piezoelectric body 2 and is electrically connected to IDT electrode layer 3. First dielectric layer 5 is formed of silicon dioxide, for example, and placed on piezoelectric body 2 so as to cover IDT electrode layer 3. Second dielectric layer 6 is formed of silicon nitride, for example, and placed on piezoelectric body 2 so as to cover first dielectric layer 5. Second dielectric layer 6 is provided with opening 7 which exposes at least a part of the top face of pad electrode layer 4. A thickness of second dielectric layer 6 is greater than wavelength λ of a principal wave excited by IDT electrode layer 3, while a thickness of first dielectric layer 5 is smaller than wavelength λ of the principal wave.

Second dielectric layer 6 covers lateral faces of pad electrode layer 4, and first dielectric layer 5 solidly touches the lateral faces of pad electrode layer 4. The lateral faces of pad electrode layer 4 are thus covered with both of first dielectric layer 5 and second dielectric layer 6 because of the following reason:

In the structure shown in FIG. 6, spaces are provided between pad electrode layer 4 and first dielectric layer 5, and between pad electrode layer 4 and second dielectric layer 6. A metal thin film is formed on the top face of pad electrode layer 4 by sputtering before developing metal plating on the top face. However, the presence of those spaces prevents metal thin film from well attaching to the walls surrounding the spaces. The reliability of connection between pad electrode layer 4 and the metal plating is thus degraded.

In order to overcome the foregoing disadvantage, the lateral faces of pad electrode layer 4 are covered with first dielectric layer 5 and second dielectric layer 6 so that the spaces therebetween can be eliminated, as shown in FIG. 5. This structure allows the metal thin film to well attach to the inner wall of second dielectric layer 6 surrounding opening 7. The connection reliability between the acoustic boundary wave device and an external electronic component (not shown) via the metal plating can be thus improved.

The acoustic boundary wave device shown in FIG. 5 includes, e.g. pad electrode layer 4 of which lateral faces are made of copper, first dielectric layer 5 made of silicon oxide, and second dielectric layer 6 made of silicon nitride. The metal forming the lateral faces of pad electrode layer 4 diffuses into first dielectric layer 5 more readily than into second dielectric layer 6. The metal thus diffuses exhaustively into first dielectric layer 5, so that the resistance of pad electrode layer 4 becomes greater. As a result, electricity passing characteristics of the acoustic boundary wave device is degraded.

The metal diffusion from the top face of IDT electrode layer 3 into first dielectric layer 5 can be prevented with ease by providing the top face of IDT electrode layer 3 with a diffusion preventive layer (not shown). IDT electrode layer 3 is placed lower than pad electrode layer 4, so that the diffusion preventive layer can be readily and positively attached to the lateral faces of IDT electrode layer 3. The metal diffusion from the lateral faces of IDT electrode layer 3 into first dielectric layer 5 can be thus prevented with ease. However, pad electrode layer 4 is placed higher than IDT electrode layer 3 and first dielectric layer 5, so that the diffusion protective layer resists attaching to the lateral faces of pad electrode layer 4. It is thus difficult to prevent the metal forming the lateral faces of pad electrode layer 4 from diffusing into first dielectric layer 5.

SUMMARY

An embodiment of the present invention aims to provide an acoustic boundary wave device in which the electricity passing characteristics is improved and also the reliability of electric connection with an external electronic component is improved. The acoustic boundary wave device of an embodiment of the present invention includes a piezoelectric body, an interdigital transducer (IDT) electrode layer, a pad electrode layer, a first dielectric layer, and a second dielectric layer. The IDT electrode layer is formed on the piezoelectric body. The pad electrode layer is formed on the piezoelectric body and electrically connected to the IDT electrode layer. The first dielectric layer is formed on the piezoelectric body so as to cover at least a part of the IDT electrode layer. The second dielectric layer is formed on the piezoelectric body so as to cover the first dielectric layer. The second dielectric layer is provided with an opening through which at least a part of a top face of the pad electrode layer is exposed. The metal forming the lateral face of the pad electrode layer diffuses more readily into the first dielectric layer than into the second dielectric layer. The second dielectric layer is formed so as to cover the lateral face of the pad electrode layer, and it prevents the first dielectric layer from touching the lateral face of the pad electrode layer.

DETAILED DESCRIPTION OF THE PREFERRED EMBODIMENTS

Figure 1:
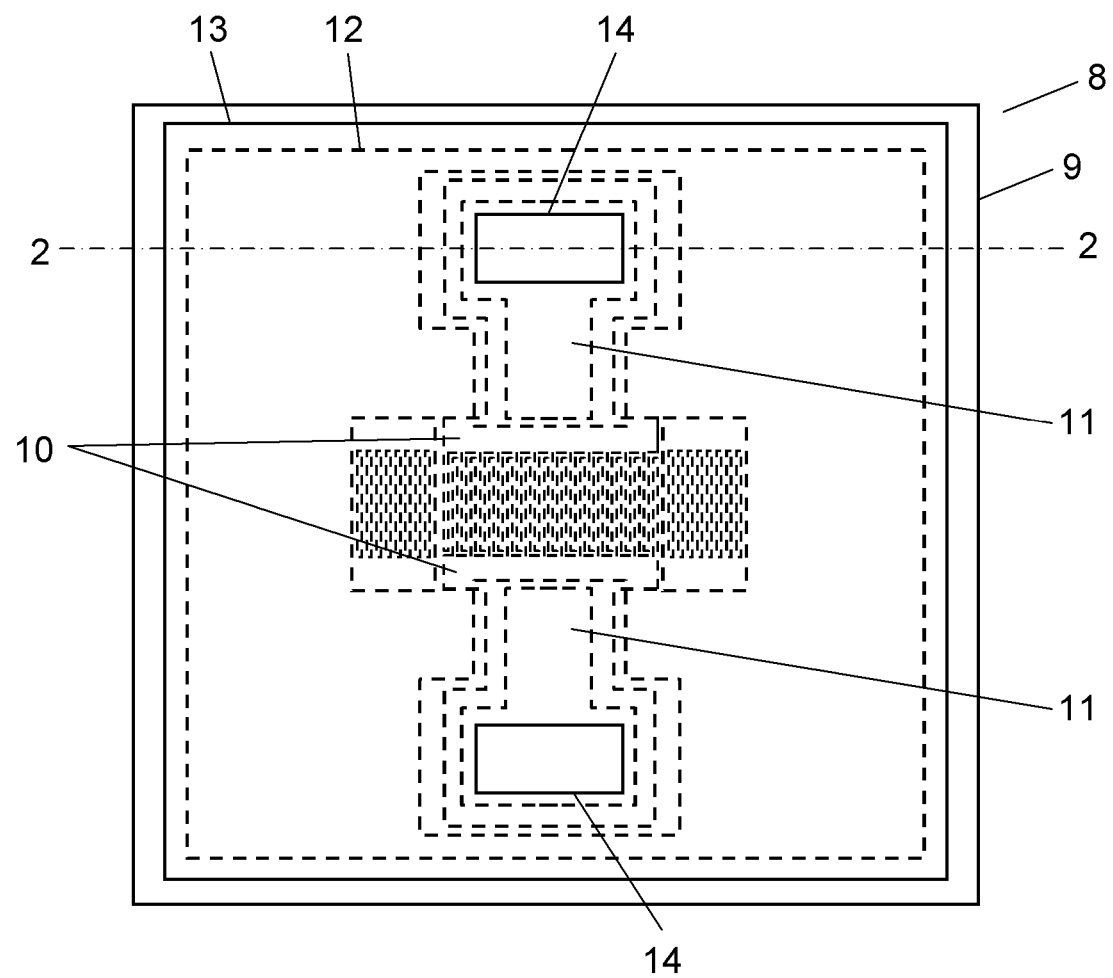
FIG. 1 is a perspective top view of an acoustic boundary wave device in accordance with an embodiment of the present invention.
Figure 2:
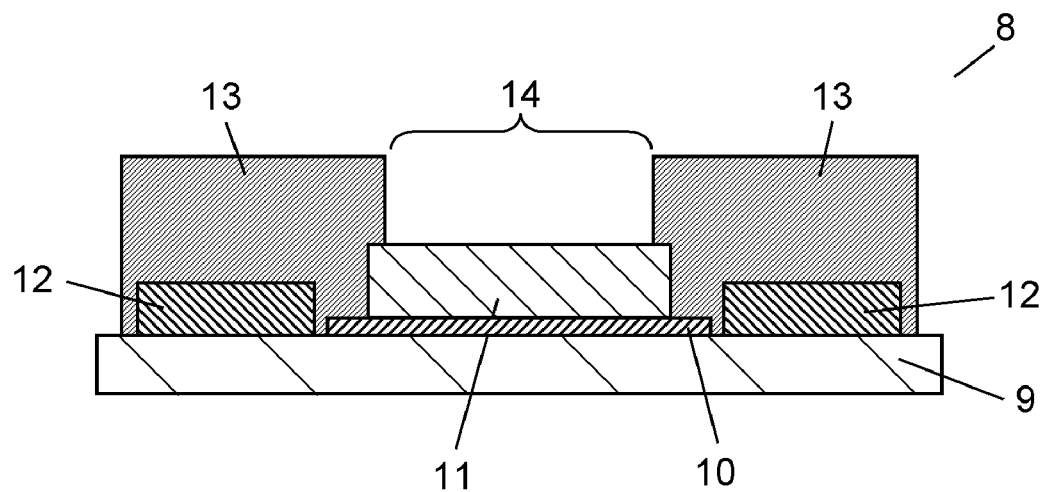
FIG. 2 is a schematic sectional view of the acoustic boundary wave device shown in FIG. 1.

FIG. 1 is a perspective top view of an acoustic boundary wave device in accordance with an embodiment of the present invention. FIG. 2 is a schematic sectional view of the acoustic boundary wave device cut along line 2-2 in FIG. 1.

Acoustic boundary wave device 8 includes piezoelectric body 9, a pair of interdigital transducer (IDT) electrode layers 10, a pair of pad electrode layers 11, first dielectric layer 12, and second dielectric layer 13. IDT electrode layers 10 are formed on piezoelectric body 9. Pad electrode layers 11 are formed on piezoelectric body 9, and each of them electrically connects with one of IDT electrode layers 10, respectively. First dielectric layer 12 is formed on piezoelectric body 9 so as to cover IDT electrode layers 10. Second dielectric layer 13 is formed on piezoelectric body 9 so as to cover first dielectric layer 12. Second dielectric layer 13 is provided with a pair of openings 14 such that at least a part of a top face of each one of pad electrode layers 11 is exposed through each one of openings 14.

Second dielectric layer 13 is thicker than pad electrode layer 11 and is formed so as to cover the lateral faces of pad electrode layer 11. First dielectric layer 12 is thinner than pad electrode layer 11, and is kept away from the lateral faces of pad electrode layer 11. In other words, second dielectric layer 13 is formed so as to cover the lateral faces of each of pad electrode layers 11 and prevents first dielectric layer 12 from touching the lateral faces of each of pad electrode layers 11.

Covering the lateral faces of each of pad electrode layers 11 with second dielectric layer 13 thus allows eliminating spaces between each of pad electrode layers 11 and second dielectric layer 13. This structure produces the following advantage: when a metal thin film is formed on the top face of each of pad electrode layers 11 by sputtering before the metal plating is developed, the metal thin film can sufficiently attach to the inner wall of second dielectric layer 13 surrounding each of openings 14. The reliability of the connection between acoustic boundary wave device 8 and an external electronic component (not shown) via the metal plating can be thus improved.

Piezoelectric body 9 is made of crystal, lithium niobate ($LiNbO_3$), lithium tantalate ($LiTaO_3$), potassium tantalate ($KTaO_3$), or potassium niobate ($KNbO_3$), for instance.

IDT electrode layers 10 are made of at least one of aluminum, copper, silver, gold, titan, tungsten, platinum and chrome, or an alloy chiefly made of these metals, or a laminated structure of these metals. IDT electrode layers 10 are formed on piezoelectric body 9 by sputtering or deposition.

The lateral faces of each of pad electrode layers 11 are made of at least one of copper, gold, and silver, or an alloy chiefly formed of these metals. Pad electrode layer 11 is formed on piezoelectric body 9 or on IDT electrode 10 by sputtering or deposition.

First dielectric layer 12 is made of silicon dioxide ($SiO_2$), for instance; however, it can be made of any medium as long as the medium has frequency-temperature characteristics reverse to that of piezoelectric body 9. This structure allows improving the frequency-temperature characteristics. First dielectric layer 12 is formed on piezoelectric body 9 or on IDT electrode layers 10 by sputtering or deposition.

Second dielectric layer 13 is made of medium through which a transverse wave travels quicker than through first dielectric layer 12. The medium is silicon nitride ($Si_3N_4$), aluminum nitride (AlN), aluminum oxide ($Al_2O_3$), silicon (Si) or the like. The thickness of second dielectric layer 13 is equal to or greater than 0.8 times of wavelength $\lambda$ of SH wave, i.e. a principal wave. This structure allows confining the principal wave within acoustic boundary wave device 8.

The thickness of second dielectric layer 13 is preferably equal to or greater than wavelength $\lambda$ of the SH wave. This thickness allows confining the principal wave almost perfectly within acoustic boundary wave device 8. Second dielectric layer 13 is formed on first dielectric layer 12 by sputtering, deposition or the similar method. Opening 14 is formed on second dielectric layer 13 and above pad electrode layer 11 by dry-etching.

The diffusivity of metal forming the lateral faces of pad electrode layer 11 into first dielectric layer 12 is greater than that into second dielectric layer 13. Namely, the metal forming the lateral faces of pad electrode layer 11 can diffuse into first dielectric layer 12 more readily than into second dielectric layer 13. However, first dielectric layer 12, through which the metal diffuses rather faster, is formed away from the lateral faces of pad electrode layer 11, thanks to the presence of second dielectric layer 13. Therefore, the metal forming the lateral faces of pad electrode layer 11 can be prevented from diffusing into first dielectric layer 12, so that pad electrode layer 11 is prevented from increasing its resistance value. As a result, the electricity passing characteristics of acoustic boundary wave device 8 can be prevented from degrading. As discussed above, the foregoing structure of acoustic boundary wave device 8 allows improving both of the electricity passing characteristics and the reliability of electrical connection between acoustic boundary wave device 8 and an external electronic component (not shown).

Figure 3:
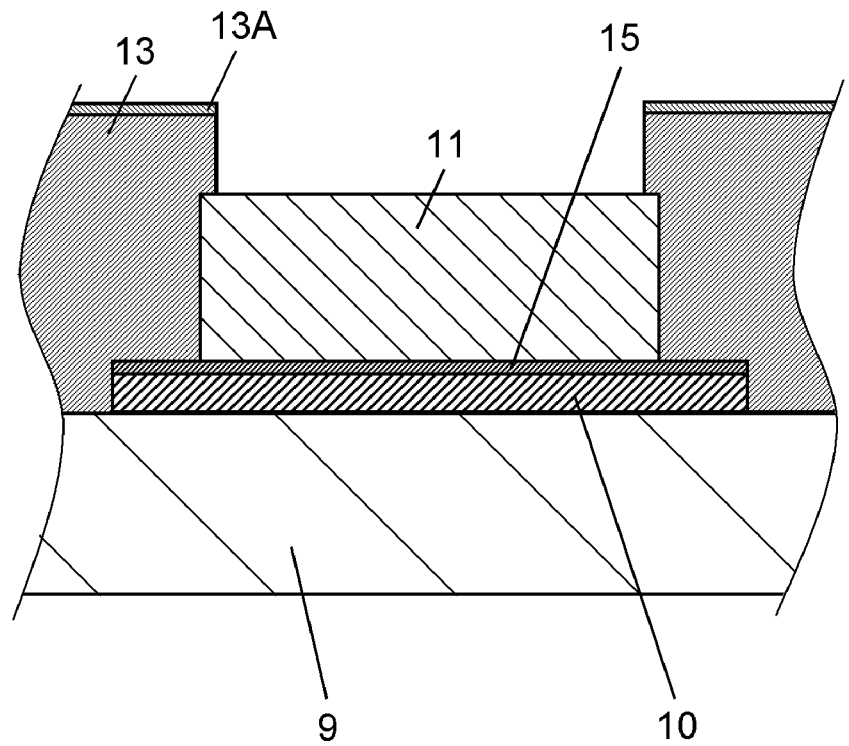
FIG. 3 is an enlarged schematic sectional view of an acoustic boundary wave device with a more preferable structure in accordance with the embodiment of the present invention.

A more preferable structure of the acoustic boundary wave device is demonstrated hereinafter with reference to FIG. 3, which shows an enlarged schematic sectional view of the acoustic boundary wave device with a more preferable structure.

First, it is preferable to form diffusion protective layer 15 made of TiN or the like on the top face of each of IDT electrode layers 10 for preventing the metal diffusion from the top face of IDT electrode layer 10 into first dielectric layer 12. Use of IDT electrode layer 10, of which thickness is smaller than that of pad electrode layer 11, in particular, allows readily and positively attaching protective layer 15 to the lateral faces of IDT electrode layer 10. The metal diffusion from the lateral faces of IDT electrode layer 10 into first dielectric layer 12 can be thus prevented with ease. Diffusion protective layer 15 is formed by sputtering, deposition or the similar method.

In a case where the moisture absorption of second dielectric layer 13 is lower than that of first dielectric layer 12, it is preferable that second dielectric layer 13 completely covers first dielectric layer 12. This structure can prevent first dielectric layer 12 from absorbing the moisture. As a result, the degradation in the electricity passing characteristics of acoustic boundary wave device 8 can be suppressed.

Furthermore, in a case where second dielectric layer 13 is made of nitride film, it is preferable to form nitride-oxide film 13A, such as silicon oxide nitride (SiON) film, on second dielectric layer 13. In other words, in a case of using second dielectric layer 13 made of at least one of silicon nitride and aluminum nitride, acoustic boundary wave device 8 preferably includes nitride-oxide film 13A formed on second dielectric layer 13. This structure allows suppressing the oxidization of second dielectric layer 13 made of nitride film, thereby preventing the characteristics of acoustic boundary wave device 8 from degrading. Nitride-oxide film 13A is formed by sputtering, deposition or the similar method.

Figure 4:
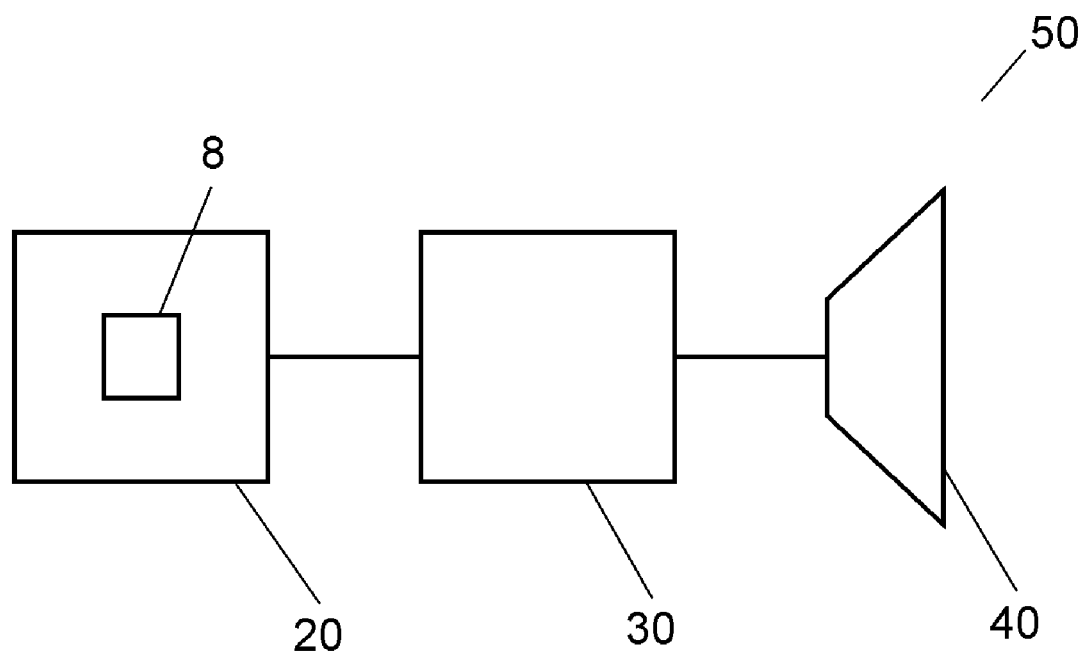
FIG. 4 is a block diagram of an electronic apparatus including the acoustic boundary wave device in accordance with the embodiment of the present invention.
Figure 5:
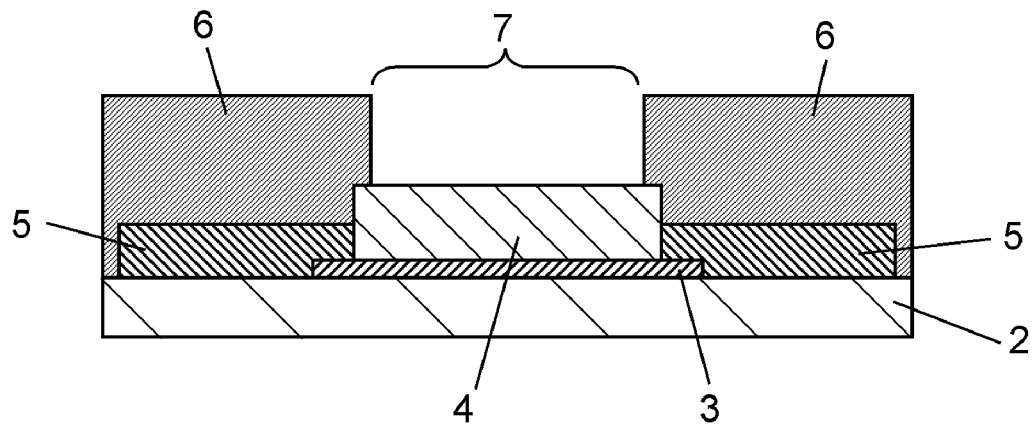
FIGS. 5 and 6 are schematic sectional views of conventional acoustic boundary wave devices.
Figure 6:
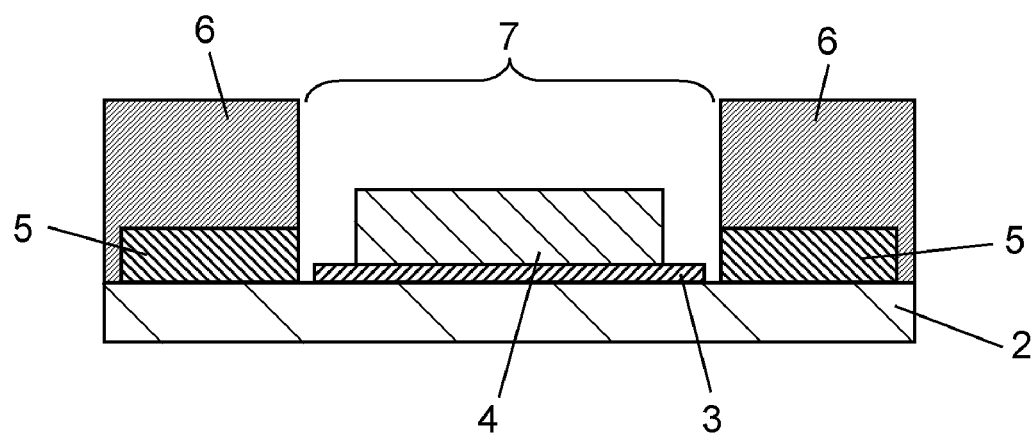

Acoustic boundary wave device 8 as discussed above can be applied to a resonator (not shown), a filter (not shown) such as a ladder type filter and a DMS filter. FIG. 4 is a block diagram of an electronic apparatus including acoustic boundary wave device 8. Electronic apparatus 50 includes filter 20 employing acoustic boundary wave device 8, semiconductor integrated circuit 30 connected to filter 20, reproducing section 40, such as a loudspeaker, connected to circuit 30. Use of acoustic boundary wave device 8 allows improving characteristics of a resonator and filter 20, and communication quality of electronic apparatus 50. Semiconductor integrated circuit 30 can be formed of a single element.

The structure shown in FIG. 1 includes a pair of IDT electrode layers 10 which work for the input side and the output side, respectively. However, the present invention is not limited to this. For instance, two IDT electrode layers for the output side can be provided with respect to one IDT electrode layer for the input side.

As discussed above, the acoustic boundary wave device of the present invention improves the electricity passing characteristics thereof and the reliability of electric connection between the acoustic boundary wave device and an external electronic component. The acoustic boundary wave device can be used in electronic apparatuses such as portable telephones.

What is claimed is:

1. An acoustic boundary wave device comprising:
   a piezoelectric body;
   an interdigital transducer electrode layer provided on the piezoelectric body;
   a pad electrode layer provided on the piezoelectric body and electrically connected to the interdigital transducer electrode layer;
   a first dielectric layer provided on the piezoelectric body to cover at least a part of the interdigital transducer electrode layer; and
   a second dielectric layer provided on the piezoelectric body to cover the first dielectric layer, and provided with an opening through which at least a part of a top face of the pad electrode layer is exposed,
   wherein diffusivity of a metal forming a lateral face of the pad electrode layer into the first dielectric layer is greater than that into the second dielectric layer,
   wherein the second dielectric layer is provided to cover lateral faces of the pad electrode layer so as to prevent the first dielectric layer from touching the lateral faces of the pad electrode layer, and
   wherein a nitride-oxide film is formed on the second dielectric layer.

2. The acoustic boundary wave device according to claim 1 further comprising a diffusion protective layer provided on a top face of the interdigital transducer electrode layer.

3. The acoustic boundary wave device according to claim 2, wherein a thickness of the interdigital transducer electrode layer is smaller than that of the pad electrode layer.

4. The acoustic boundary wave device according to claim 1, wherein moisture absorption of the second dielectric layer is lower than that of the first dielectric layer.

5. The acoustic boundary wave device according to claim 1, wherein the lateral faces of the pad electrode layer is chiefly made of at least one metal selected from a group consisting of copper, gold, and silver,
   wherein the first dielectric layer is made of silicon dioxide, and
   wherein the second dielectric layer is made of at least one material selected from a group consisting of silicon nitride, aluminum nitride, aluminum oxide, and silicon.

6. The acoustic boundary wave device according to claim 1, wherein the second dielectric layer is made of at least one of silicon nitride and aluminum nitride.

7. An electronic apparatus comprising:
   a filter including an acoustic boundary wave device;
   a semiconductor integrated circuit connected to the filter; and
   a reproducing section connected to the semiconductor integrated circuit, wherein the acoustic boundary wave device includes:
   a piezoelectric body;
   an interdigital transducer electrode layer provided on the piezoelectric body;
   a pad electrode layer provided on the piezoelectric body and electrically connected to the interdigital transducer layer;
   a first dielectric layer provided on the piezoelectric body to cover at least a part of the interdigital transducer electrode layer; and
   a second dielectric layer provided on the piezoelectric body to cover the first dielectric layer, and provided with an opening through which at least a part of a top face of the pad electrode layer is exposed,
   wherein a diffusivity of metal forming a lateral face of the pad electrode layer into the first dielectric layer is greater than that into the second dielectric layer,
   wherein the second dielectric layer is provided to cover lateral faces of the pad electrode layer so as to prevent the first dielectric layer from touching the lateral faces of the pad electrode layer, and
   wherein a nitride-oxide film is formed on the second dielectric layer.

* * * * *